United States Patent [19]
Hodges et al.

[11] Patent Number: 6,011,711
[45] Date of Patent: *Jan. 4, 2000

[54] SRAM CELL WITH P-CHANNEL PULL-UP SOURCES CONNECTED TO BIT LINES

[75] Inventors: Robert Louis Hodges, Phoenix, Ariz.; Frank Sigmund, Coppell, Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/775,141

[22] Filed: Dec. 31, 1996

[51] Int. Cl.[7] .................................................... G11C 11/00

[52] U.S. Cl. ........................ 365/154; 365/156; 365/203

[58] Field of Search .................................... 365/154, 156, 365/190, 202, 203

[56] References Cited

U.S. PATENT DOCUMENTS

| | | | |
|---|---|---|---|
| 4,198,695 | 4/1980 | McElroy | 365/154 |
| 4,839,862 | 6/1989 | Shiba et al. | 365/154 |
| 5,477,501 | 12/1995 | Suzuki | 365/230.01 |

*Primary Examiner*—David Nelms
*Assistant Examiner*—Hoai V. Ho
*Attorney, Agent, or Firm*—Theodore E. Galanthay; Lisa K. Jorgenson; Dan Venglarik

[57] ABSTRACT

A static random access memory cell comprising a storage latch having a first upper power supply voltage connection to a first bit line, a second upper power supply voltage connection to a second bit line, and a connection to a lower power supply voltage. A first access circuit connects the storage latch to the first bit line and a second access circuit connects the storage latch to the second bit line, wherein the storage latch is accessed utilizing the first access circuit and the second access circuit.

22 Claims, 2 Drawing Sheets

SRAM CELL WITH P-CHANNEL PULL-UP SOURCES CONNECTED TO BIT LINES

BACKGROUND OF THE INVENTION

1. Technical Field

The present invention relates to integrated circuits, and more specifically to a static random access memory device.

2. Description of the Related Art

In general, semiconductor memories may be divided into two types, volatile memories and non-volatile memories. Volatile memories lose stored data when power is removed while non-volatile memories retain stored data when power is removed. The most basic part of a semiconductor memory is the data storage cell, which can be anything that can store two well defined states in a specified and repeatedly accessible location. In semiconductor memories, the most common storage device elements are either a latch or a capacitor. When a memory bit is stored in a latch, or a big-stable flip-flop, the cell is said to be static cell because it does not require its data to be refreshed as long as power is applied to the cell. Latched semiconductor storage cells are big-stable transistor flip-flops in various configurations. Semiconductor flip-flops can be made using either metal oxide semiconductor (MOS) or bipolar transistors.

Static random access memory (SRAM) cells are volatile memory cells. SRAM memory cells are generally either four transistor or six transistor memory cells. Each SRAM cell is coupled to a bit line pair and to a word line. Data is read from or written into a selected SRAM cell via the bit line pair. SRAMS are generally used in applications requiring high speed operations, such as a cache memory for a data processing system. Unlimited numbers of write operations can be performed on an SRAM without reducing reliability.

As can be seen with reference to FIG. 1, static random access memory cell 100 includes two load elements L1 and L2 and two storage transistors T1 and T2. Additionally, two access transistors T3 and T4 are included to access SRAM cell 100. In FIG. 1, the transistors are MOS transistors with load devices L1 and L2, which may be, for example, depletion mode transistors in a NMOS cell. The load devices are typically PMOS transistors in a CMOS cell and load resistors are used in a mix-MOS or R-load cell. Typically, storage transistors T1 and T2 and access transistors T3 and T4 are enhancement type NMOS transistors. Power is provided to cell 100 by connecting load elements L1 and L2 to an upper power supply voltage VCC and the drains of transistors T1 and T2 to a lower power supply voltage VSS.

Data is stored as voltage levels within the two sides of the flip-flop in opposite voltage configurations. In other words, node A is high when node B is low in one state and node A is low when node B is high in a second state, resulting in two stable states.

When loads L1 and L2 are p-channel pull-up transistors connected to an upper power supply voltage, Vcc, the busing requirements use to route Vcc throughout the memory array requires significant amounts of real estate on the chip and becomes a key limitation of cell size scaling in static random access memory cells. Therefore, it would be advantageous to have an improved SRAM cell in which scaling limitations caused by the routing of the upper power supply voltage to cells is reduced.

SUMMARY OF THE INVENTION

The present invention provides a static random access memory cell that has a storage latch including two connections for reading and writing data into the latch. Access to these connections are provided by a first access circuit and a second access circuit in which the first access circuit provides a connection from the latch to a first bit line and the second access circuit provides a connection from the latch to a second bit line. The access circuits are controlled by a word line. A first power supply voltage is provided to the latch by a connection to the first and second bit lines. Additionally, the latch is connected to a second power supply voltage.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
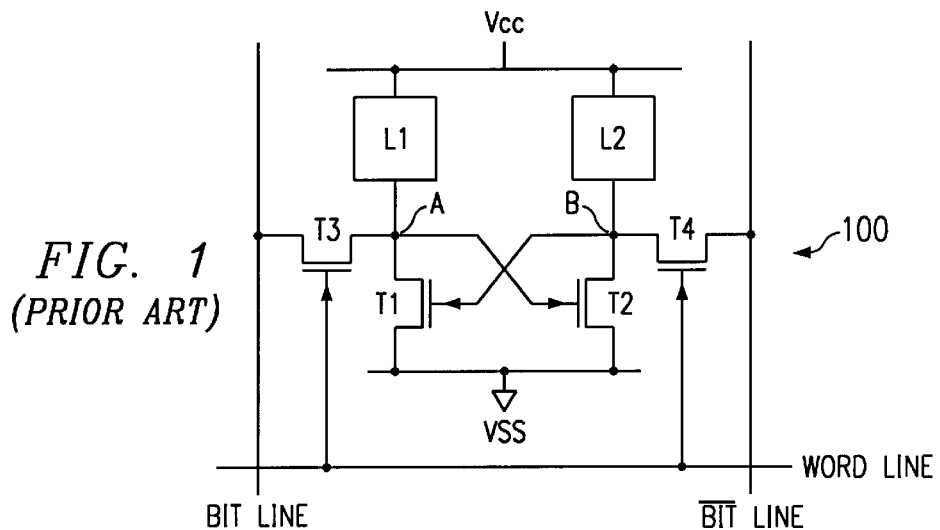
FIG. 1 is schematic diagram of a static random access memory cell known in the art.
Figure 2:
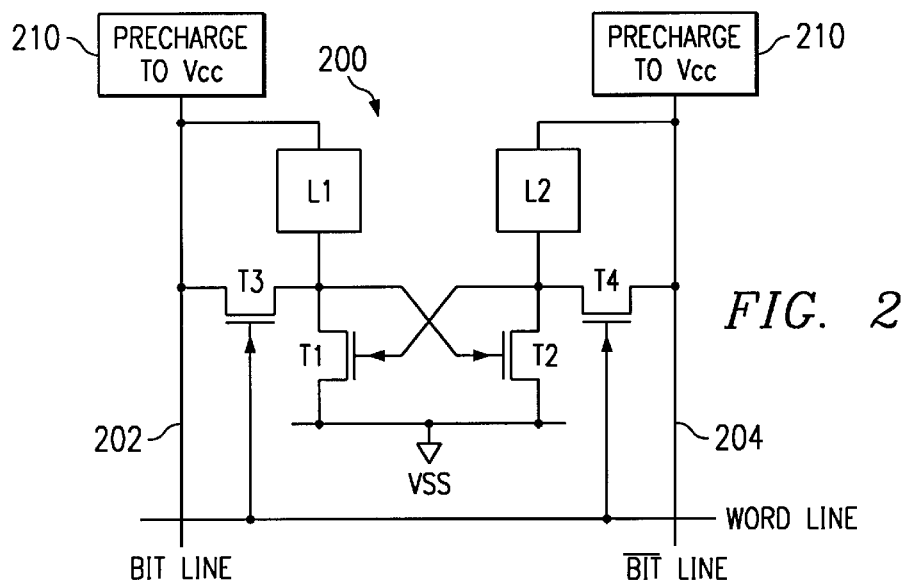
FIG. 2 is a schematic diagram of a SRAM cell depicted according to the present invention.

With reference now to FIG. 2, a schematic diagram of a SRAM cell 200 is depicted according to the present invention. As can be seen, SRAM cell 200 is similar to SRAM cell 100 in FIG. 1 except that load elements L1 and L2 are not directly connected to upper power supply voltage Vcc. Instead, load element L1 is connected to bit line 202 while load element L2 is connected to bit line 204 according to the present invention. Bit line 204 is a complementary bit line to bit line 202.

Bit lines 202 and 204 are precharged to VCC by precharge units 210. In reading the cells, one of the other bit line begins to discharge through the access transistors and either transistor T1 or T2, depending on whichever transistor has been turned on. When the changed voltage is a few tenths of a volt in many cases, a sense amplifier (not shown) will be able to sense the difference and read the data in SRAM cell 200. Shortly after reading the cell, the precharged cycle begins again.

Figure 3:
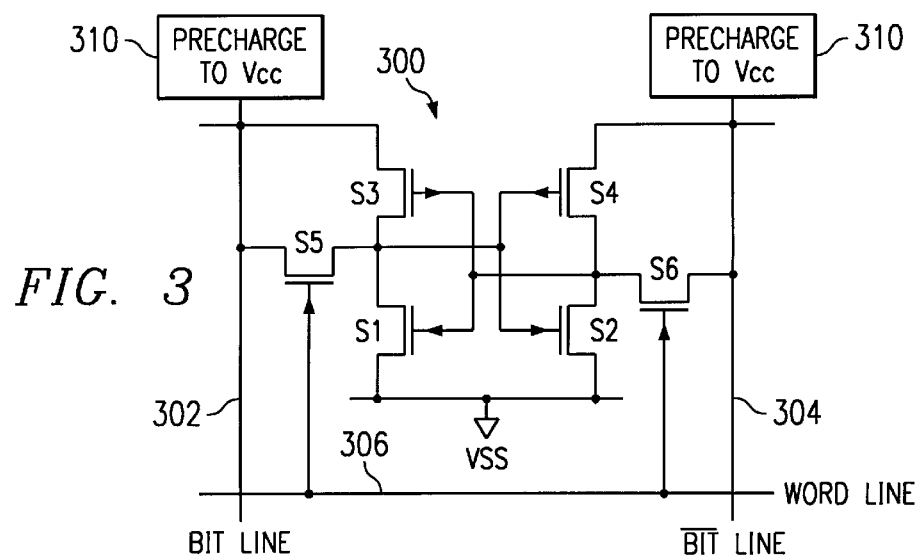
FIG. 3 is a schematic diagram of a 6-T SRAM cell depicted according to the present invention.

Turning now to FIG. 3, a schematic diagram of a 6-T SRAM cell is depicted according to the present invention.

SRAM cell 300 includes transistors S1–S6. Transistors S1–S4 form a latch within SRAM cell 300. Transistors S1, S2, S5, and S6 are NMOS transistors while transistors S3 and S4 are PMOS transistors. The latch can be characterized as a pair of cross-coupled inverters in which the first inverter is formed by transistors S1 and S3 and the second inverter is formed by transistors S2 and S4. Transistors S1 and S2 have their drains connected to a lower power supply voltage VSS. An upper power supply voltage is provided by connecting the sources of transistors S3 and S4 to bit lines 302 and 304, respectively. Bit lines 302 and 304 are precharged to VCC by precharge units 301.

In the depicted example, transistors S1 and S2 are the storage transistors while transistors S3 and S4 form the load elements in SRAM cell 300. Transistors S5 and S6 are the access transistors, forming a first and second access circuit for controlling the reading and writing of data into the latch. Transistors S5 and S6 are connected to bit line 302 and complementary bit line 304. The gates of access transistors S5 and S6 are controlled by word line 306. As can be seen in the depicted example, transistor S3 is connected to bit line 302 while transistor S4 is connected to complementary bit line 304. The bit lines provide power to SRAM cell 300 in the depicted example. According to the present invention, pull-up transistors S3 and S4 may be metal oxide semiconductor (MOS) p-channel thin film transistors (TFTs). TFTs provide for a more compact cell than a typical p-channel pull-up transistors.

Figure 4:
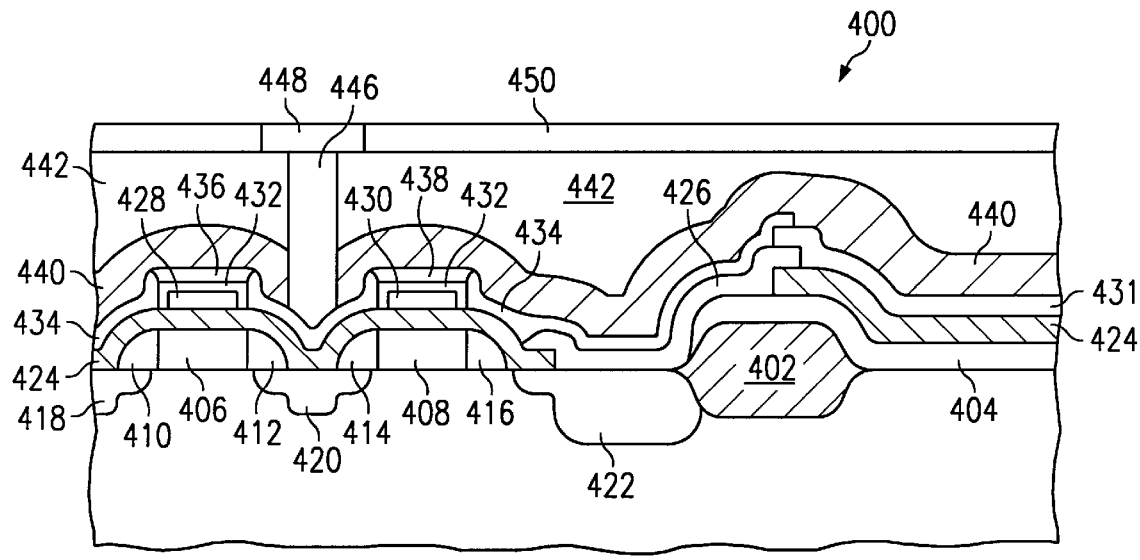
FIG. 4 is a cross-sectional view of pull-up transistors and access transistors depicted according to the present invention.

Turning now to FIG. 4, a cross-sectional view of pull-up transistors and access transistors are depicted according to the present invention. In particular, FIG. 4 shows an access transistor and a pull-up transistor for two adjacent cells sharing a single bit line connection. Substrate 400 has a field oxide 402 extending into and above substrate 400. A gate oxide layer is formed over substrate 400 (not shown). Polysilicon layer 404 is formed over and in contact with the surfaces of substrate 400 and field oxide 402. Polysilicon layer 404 is a poly-1 layer in the depicted example. Portions of polysilicon layer 404 are removed to form gates 406 and 408. Additionally, sidewalls 410, 412, 414, and 416 are formed as can be seen in FIG. 4. Gates 406 and 408 are the gates of access transistors such as transistor S5 in FIG. 3. Source/drain regions 418, 420, and 422 are formed in substrate 400. Oxide layer 424 is formed over the structures with portions removed as shown in FIG. 4.

Polysilicon layer 426 is then formed. Polysilicon layer 426 is a poly-2 layer in the depicted example, and portions of polysilicon layer 426 are removed to form gates 428 and 430. Polysilicon layer 431 is formed over oxide layer 424. These gates are those of pull-up transistors, such as transistor S3 in FIG. 3. A gate oxide layer 432 is formed over polysilicon gates 428 and 430. Thereafter, polysilicon layer 434, which is a poly-3 layer, is formed. Channel portions 436 and 438 are doped portions of polysilicon layer 434, which form channels for these pull-up transistors, which are thin film transistors. A deep field interlevel oxide layer 440 is formed over the structures with a planarizing layer 442 being formed. Planarizing layer 442 may be a BPSG layer or a PSG layer. A bit line connection 446 is provided by forming an opening through the overlying oxide layers and filling it with a conductor. In the depicted example, bit line 446 may be in the form of a tungsten plug. A connector 448 is provided along with an overall layer 450. Bit line connection 446 provides a connection for the thin film pull-up transistors and access transistors to the bit line. Source/drain 422 provides a common node to the p-channel transistors. This common node is located between the access transistor and the puller transistor. An additional n-channel transistor also will be connected to this common node.

Figure 5:
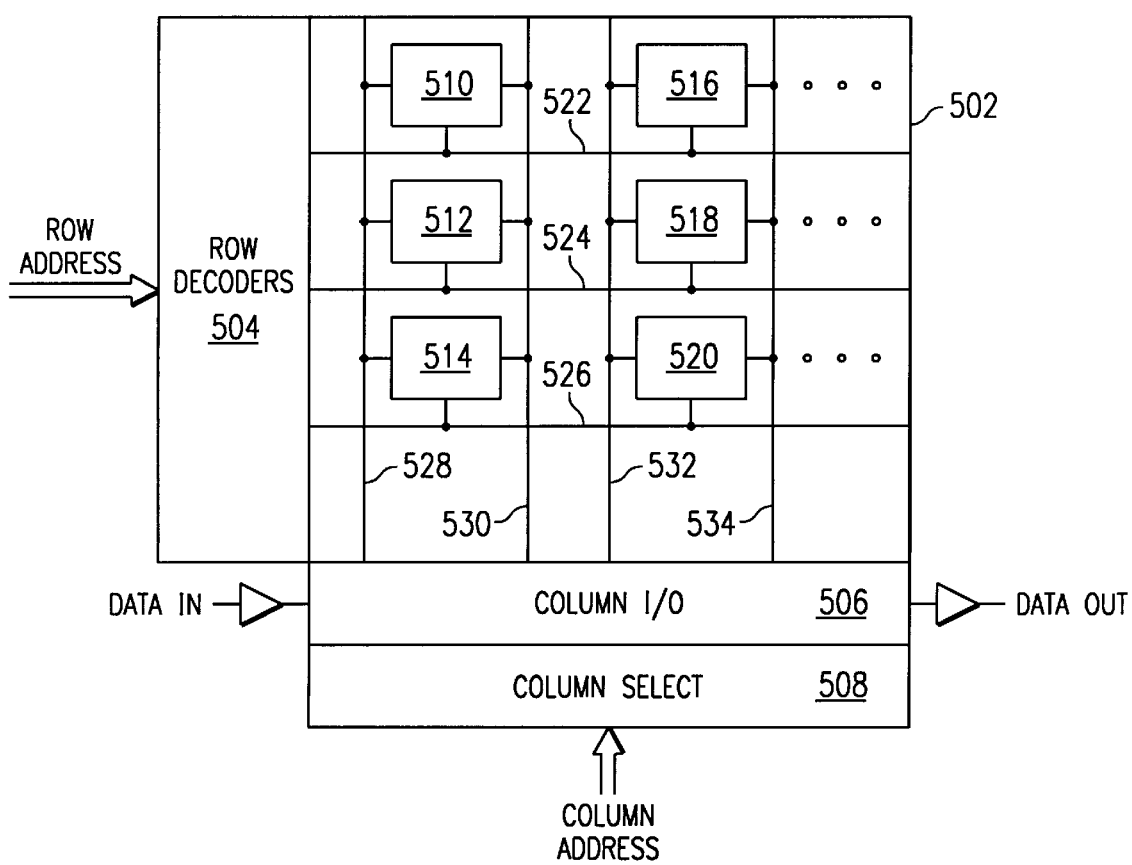
FIG. 5 is a block diagram of a memory depicted according to the present invention.

With reference now to FIG. 5, a block diagram of a memory 500 is depicted according to the present invention. Memory 500 includes memory array 502, row decoders 504 column input/output (I/O) 506, and column select 508. Memory array 502 contains memory cells 510–520 arranged in a matrix of rows and columns and connected to word lines and bit line pairs. The memory cells are located at intersections of word lines and bit line pairs. The cells depicted in FIGS. 2 and 3 are implemented within the memory cells depicted in FIG. 4 according to the present invention.

Word lines 522, 524, and 526 are connected to row decoders 504. Bit lines 528, 530, 532, and 534 are connected to column I/O 506 and column select 508. Bit lines 528 and 530 form one bit line pair while bit lines 532 and 534 form another bit line pair. Column select 508 address signals labeled Column Addresses while row decoders 504 receives address signals labeled Row Addresses. These address are used to select cells within memory array 502 for reading or writing according to the present invention.

Thus, the present invention provides a smaller cell area by connecting the upper power supply voltage of the cell to the bit lines, rather than directly to the upper power supply voltage. Additionally, the present invention provides a cell that is compatible with standard CMOS processing.

While the invention has been particularly shown and described with reference to a preferred embodiment, it will be understood by those skilled in the art that various changes in form and detail may be made therein without departing from the spirit and scope of the invention.

What is claimed is:

1. A static random access memory cell comprising:
    a storage latch having a first connection to a first bit line precharged to an upper power supply voltage, a second connection to a second bit line precharged to the upper power supply voltage, and a third connection to a lower power supply voltage;
    a first access circuit connecting the storage latch to the first bit line; and
    a second access circuit connecting the storage latch to the second bit line, wherein data in the storage latch is accessed utilizing the first access circuit and the second access circuit,
    wherein the storage latch includes a first thin film transistor load element formed over the first access circuit and connecting the storage latch to the first bit line and a second thin film transistor load element formed over the second access circuit and connecting the storage latch to the second bit line.

2. The static random access memory of claim 1, wherein the first access circuit is a first transistor having a first source/drain connected to the bit line and a second source/drain connected to the storage latch, and the second access circuit is a second transistor having a first source/drain connected to the second bit line and a second source/drain connected to the storage latch.

3. The static random access memory of claim 2, wherein the first transistor and the second transistor each have a gate connected to a word line.

4. The static random access memory of claim 3, wherein the storage latch comprises a first inverter and a second inverter, wherein the first and second inverters form a pair of cross-coupled inverters.

5. The static random access memory of claim 4, wherein the pair of cross coupled inverters includes four transistors.

6. The static random access memory of claim 5, wherein the four transistors comprises two p-channel transistors and two n-channel transistors, wherein the two p-channel transistors are pull-up transistors within the cross-coupled inverters and form the first and second load elements.

7. The static random access memory of claim 3, wherein the storage latch comprises:
   a first transistor and a second transistor, wherein the first transistor has a first source/drain connected to the first load and the second transistor has a first source/drain connected to the second load, the first load having a connection to the first bit line and the second load having a connection to the second bit line, the first transistor having a second source/drain connected to a lower power supply voltage and the second transistor having a second source/drain connected to the lower power supply voltage, the first transistor having a gate connected to the first source/drain of the second transistor, and the second transistor having a gate connected to the first source/drain of the first transistor.

8. The static random access memory of claim 7, wherein the first load and the second load are p-channel transistors.

9. The static random access memory of claim 1, wherein the storage latch comprises:
   a first p-channel transistor having a first source/drain, a second source/drain, and a gate, the first source/drain being connected to the first bit line and the second source/drain being connected to the second load element, wherein the first p-channel transistor forms the first load element;
   a second p-channel transistor having a first source/drain, a second source/drain, and a gate, the first source/drain being connected to the second bit line and the second source/drain being connected to the first load element, wherein the second p-channel transistor forms the second load element;
   a first n-channel transistor having a first source/drain connected to the lower power supply voltage, a second source/drain connected to the second source/drain of the first p-channel transistor, and a gate connected to the second source/drain of the second p-channel transistor; and
   a second n-channel transistor having a first source/drain connected to the lower power supply voltage, a second source/drain connected to the second source/drain of the second p-channel transistor, and a gate connected to the second source/drain of the first p-channel transistor.

10. The static random access memory of claim 9, further comprising:
    a third n-channel transistor having a first source/drain connected to the second source/drain of the first n-channel transistor, a second source/drain connected to the first bit line, and a gate connected to a word line, wherein the third n-channel transistor forms the first access circuit and the first p-channel transistor is formed over the third n-channel transistor; and
    a fourth n-channel transistor having a first source/drain connected to the second source/drain of the second n-channel transistor, a second source/drain connected to the second bit line, and a gate connected to the word line, wherein the fourth n-channel transistor forms the second access circuit and the second p-channel transistor is formed over the fourth n-channel transistor.

11. The static random access memory of claim 1, wherein the storage latch comprises:
    a first transistor having a first source/drain, a second source/drain, and a gate; and
    a second transistor having a first source/drain, a second source/drain, and a gate, wherein the gate of the second transistor is connected to the first source/drain of the first transistor, the gate of the first transistor is connected to the first source/drain of the second transistor, and the second source/drain of the first transistor and the second source/drain of the second transistor are connected to the lower power supply voltage,
    wherein the first load element has a first connection to the first source/drain of the first transistor and a second connection to the first bit line,
    wherein the second load element has a first connection to the first source/drain of the second transistor and a second connection to the second bit line.

12. The static random access memory of claim 10, wherein the second bit line is a bit line complementary to the first bit line.

13. The static random access memory of claim 1, wherein the first load element is a p-channel transistor and the second load element is a p-channel transistor.

14. A static random access memory comprising:
    a plurality of word lines;
    a first plurality of bit lines;
    a second plurality of bit lines; and
    a plurality of cells, each cell within the plurality of cells including:
        a storage latch having a first connection to a bit line within the first plurality of bit lines and a second connection to a bit line within the second plurality of bit lines and a third connection to a second power supply voltage, wherein the first and second plurality of bit lines are precharged to a first power supply voltage;
        a first access transistor having a first source/drain connected to the storage latch and a second source/drain connected to the bit line within the first plurality of bit lines, and a gate connected to a word line within the plurality of word lines; and
        a second access transistor having a first source/drain connected to the storage latch, a second source/drain connected to the bit line within the second plurality of bit lines, and a gate connected to the word line,
        wherein the storage latch includes a first thin film transistor load element formed over the first access transistor and connecting the storage latch to the first bit line and a second thin film transistor load element formed over the second access transistor and connecting the storage latch to the second bit line.

15. The static random access memory of claim 14, wherein the first access transistor is an n-channel transistor and the second access transistor is an n-channel transistor.

16. The static random access memory of claim 14, wherein the storage latch comprises a pair of cross-coupled inverters.

17. The static random access memory of claim 16, wherein the pair of cross-coupled inverters includes four transistors.

18. The static random access memory of claim 17, wherein the four transistors are two p-channel transistors and two n-channel transistors, wherein the p-channel transistors are pull-up transistors forming the first and second load elements.

19. The static random access memory of claim 14, wherein the storage latch comprises:
    a first p-channel transistor forming the first load element and having a first source/drain, a second source/drain, and a gate, the first source/drain being connected to the bit line within the first plurality of bit lines and the second source/drain being connected to the second load element;

a second p-channel transistor forming the second load element and having a first source/drain, a second source/drain, and a gate, the first source/drain being connected to the bit line within the second plurality of bit lines and the second source/drain being connected to the first load element;

a first n-channel transistor having a first source/drain connected to the second power supply voltage, a second source/drain connected to the second source/drain of the first p-channel transistor, and a gate connected to the second source/drain of the second p-channel transistor;

a second n-channel transistor having a first source/drain connected to the second power supply voltage, a second source/drain connected to the second source/drain of the second p-channel transistor, and a gate connected to the second source/drain of the first p-channel transistor;

a third n-channel transistor having a first source/drain connected to the second source/drain of the first n-channel transistor, a second source/drain connected to the bit line within the first plurality of bit lines, and a gate connected to a word line;

a fourth n-channel transistor having a first source/drain connected to the second source/drain of the second n-channel transistor, a second source/drain connected to the bit line within the second plurality of bit lines, and a gate connected to the word line.

20. The static random access memory of claim 19, wherein the first p-channel transistor and the second p-channel transistor are metal oxide semiconductor transistors.

21. A static random access memory cell comprising:

a first, thin film p-channel transistor having a first source/drain, a second source/drain, and a gate, the first source/drain being connected to a first bit line precharged to a first power supply voltage and the second source/drain being connected to a gate of a second p-channel transistor;

the second, thin film p-channel transistor having a first source/drain, a second source/drain, and a gate, the first source/drain of the second p-channel transistor being connected to a second bit line precharged to the first power supply voltage and the second source/drain of the second p-channel transistor being connected to the gate of the first p-channel transistor;

a first n-channel transistor having a first source/drain connected to a second power supply voltage, a second source/drain connected to the second source/drain of the first p-channel transistor, and a gate connected to the second source/drain of the second p-channel transistor;

a second n-channel transistor having a first source/drain connected to the second power supply voltage, a second source/drain connected to the second source/drain of the second p-channel transistor, and a gate connected to the second source/drain of the first p-channel transistor; and a third n-channel transistor having a first source/drain connected to the second source/drain of the first n-channel transistor, a second source/drain connected to the first bit line, and a gate connected to a word line;

a fourth n-channel transistor having a first source/drain connected to the second source/drain of the second n-channel transistor, a second source/drain connected to the second bit line, and a gate connected to the word line, wherein the third n-channel transistor and the fourth n-channel transistor are access transistors and the first and second p-channel transistors are formed over the third and fourth n-channel transistors.

22. The static random access memory of claim 21, wherein the transistors are metal oxide semiconductor transistors.

* * * * *